(12) United States Patent
Min et al.

(10) Patent No.: US 9,159,803 B2
(45) Date of Patent: Oct. 13, 2015

(54) SEMICONDUCTOR DEVICE WITH HCI PROTECTION REGION

(75) Inventors: Won Gi Min, Chandler, AZ (US); Hongning Yang, Chandler, AZ (US); Jiangkai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 79 days.

(21) Appl. No.: 13/590,995

(22) Filed: Aug. 21, 2012

(65) Prior Publication Data

US 2014/0054694 A1 Feb. 27, 2014

(51) Int. Cl.
*H01L 29/78* (2006.01)
*H01L 29/66* (2006.01)
*H01L 29/06* (2006.01)
H01L 29/40 (2006.01)
H01L 29/08 (2006.01)
H01L 29/10 (2006.01)

(52) U.S. Cl.
CPC ...... *H01L 29/66659* (2013.01); *H01L 29/0619* (2013.01); *H01L 29/0646* (2013.01); *H01L 29/0653* (2013.01); *H01L 29/7835* (2013.01); H01L 29/063 (2013.01); H01L 29/0847 (2013.01); H01L 29/1083 (2013.01); H01L 29/402 (2013.01)

(58) Field of Classification Search
CPC ..................... H01L 29/7816; H01L 29/66681
See application file for complete search history.

(56) References Cited

U.S. PATENT DOCUMENTS

| | | | |
|---|---|---|---|
| 7,297,606 B2 | 11/2007 | Shibib et al. | |
| 7,902,020 B2 * | 3/2011 | Park | 438/227 |
| 2003/0001216 A1 * | 1/2003 | de Fresart et al. | 257/409 |
| 2005/0275037 A1 * | 12/2005 | Chung | 257/374 |
| 2010/0025765 A1 * | 2/2010 | Yang et al. | 257/343 |
| 2010/0084708 A1 * | 4/2010 | Park | 257/343 |
| 2010/0301403 A1 | 12/2010 | Min et al. | |
| 2011/0049620 A1 * | 3/2011 | Chen et al. | 257/336 |
| 2011/0101425 A1 * | 5/2011 | Grote et al. | 257/288 |
| 2011/0260247 A1 | 10/2011 | Yang et al. | |
| 2012/0187485 A1 * | 7/2012 | Morioka | 257/343 |

* cited by examiner

*Primary Examiner* — Benjamin Sandvik
(74) *Attorney, Agent, or Firm* — Lempia Summerfield Katz LLC

(57) ABSTRACT

A device includes a semiconductor substrate, a drift region in the semiconductor substrate and having a first conductivity type, an isolation region within the drift region, and around which charge carriers drift on a path through the drift region during operation, and a protection region adjacent the isolation region in the semiconductor substrate, having a second conductivity type, and disposed along a surface of the semiconductor substrate.

20 Claims, 3 Drawing Sheets

SEMICONDUCTOR DEVICE WITH HCI PROTECTION REGION

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor is a laterally diffused metal-oxide-semiconductor (LDMOS) transistor. In an LDMOS device, a drift space is provided between the channel region and the drain region.

LDMOS devices may be designed to operate in a high-side configuration in which all of the device terminals are level shifted with respect to the substrate potential. Devices configured for high-side operation have been applied in power switchers in DC-to-DC converters, which have respective LDMOS devices for the high side and low side. High-side capable devices may be designed to prevent a direct punch-through path from a body region of the LDMOS device to an underlying substrate.

LDMOS devices are often used in applications, such as automotive applications, involving operational voltages greater than 40 volts. Breakdown resulting from applying such high voltages to the drain is often prevented through a reduced surface field (RESURF) structure in the LDMOS device design. The RESURF structure is designed to deplete the drift space of the LDMOS device in both vertical and lateral directions, thereby reducing the electric field near the surface at the drift region and thus raising the off-state breakdown voltage (BVdss) of the device.

The potential for damage from high energy charge carriers increases with the higher operating voltages achieved via RESURF and other LDMOS design features. The higher operating voltages lead to higher electric fields, which, in turn, increase the energy imparted to the charge carriers within the device. Device degradation typically arises from the injection of high energy charge carriers, or hot carriers, into the gate oxide, an interlayer dielectric, or field oxide structure of the device. The resulting buildup of charge in the dielectrics from such hot carrier injection (HCI) leads to variations in operational characteristics, such as the threshold voltage or on-state current, and performance of the device, such as performance at high frequencies.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Figure 1:
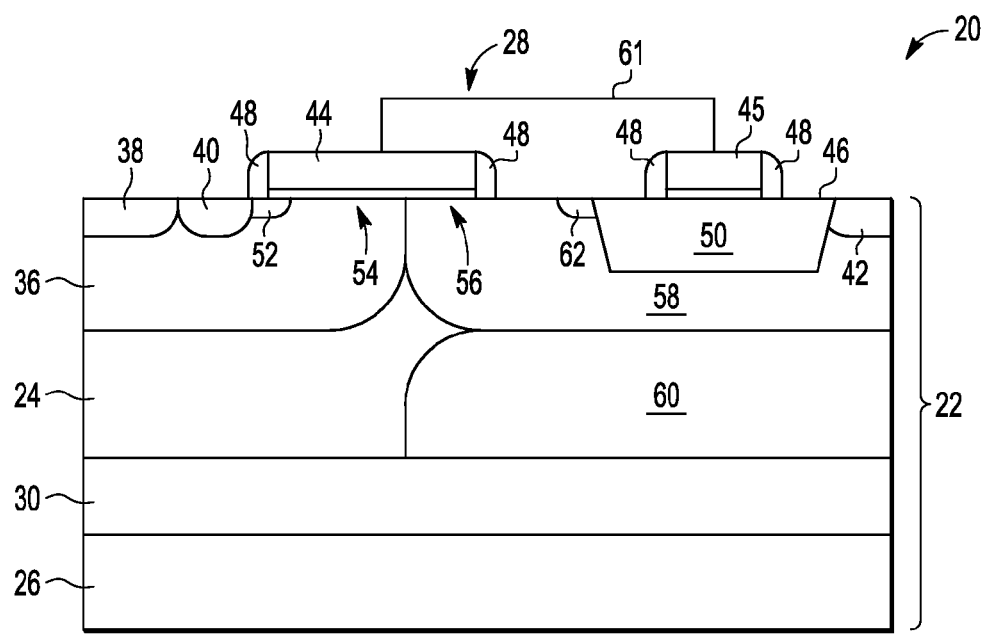
FIG. 1 is a cross-sectional, schematic view of an exemplary field drift LDMOS transistor with an accumulation region having an HCI protection region configured in accordance with one embodiment.

Laterally diffused metal oxide semiconductor (LDMOS) and other power transistor devices and electronic apparatus with an HCI protection region are described. The HCI protection region may be disposed in an accumulation region of the disclosed devices and electronic apparatus. The HCI protection region may be disposed along a shallow trench isolation (STI) or other isolation region disposed within, on, or otherwise adjacent to a drift region of the disclosed devices and electronic apparatus. The location and configuration of the HCI protection region may help avoid HCI degradation in the isolation region. The HCI protection region may have a conductivity type opposite that of the accumulation region and/or the drift region. The HCI protection region may be disposed along a surface of a semiconductor substrate in which the isolation region, drift region, and other regions of the disclosed devices are formed.

The location of the HCI protection region relative to other structures, components, or features of the disclosed devices may vary. For example, in some cases, the HCI protection region is disposed between a pair of gate structures arranged in a split-gate configuration. In other cases, a gate structure laterally extends over the HCI protection region. In still other cases, the HCI protection region is self-aligned with an edge of a gate structure.

The shape, lateral distribution, depth, and/or other characteristics of the HCI protection region may vary. For example, the HCI protection region may be formed through a shallow doped region, as in, e.g., a lightly doped drain (LDD) region. Alternatively, the HCI protection region may be configured as a halo or other peripheral region surrounding an LDD or other region. In some cases, the HCI protection region surrounds an internal region having a conductivity type that matches that of the accumulation region and/or the drift region. The internal region may have a dopant concentration level that corresponds with a lightly or moderately doped region, such as a lightly doped drain (LDD) region.

The HCI protection region may provide a number of benefits during operation beyond improving HCI reliability. For example, the potential of the HCI protection region may follow the potential of the device body (e.g., a p-type body region). With the potential distribution at the surface more uniform, the HCI protection region may reduce the electric field and hot carrier energy in an accumulation region of the device. Any hot carriers that are generated in the accumulation region are blocked by the HCI protection to relieve HCI stress on an STI sidewall, thereby improving HCI reliability. The counterdoping of the accumulation region provided by the HCI protection region may also reduce the total charge in the accumulation region during breakdown conditions. With the reduced total charge, the electric field at the device junctions (e.g., the body/drift junction) and impact ionization at such junctions are reduced. The BVdss breakdown level of the disclosed devices may thus increase.

Although described below in connection with n-channel LDMOS transistors, the disclosed devices are not limited to any particular transistor configuration. For instance, application of the features of the disclosed devices is not limited to LDMOS or other power MOS devices. One or more features of the disclosed devices may be applied to other device configurations, including, for instance, bipolar transistors. The floating regions of the disclosed devices may be useful in a wide variety of power electronic devices. The floating regions are also not limited to any one particular type of RESURF configuration. The disclosed devices may have varying RESURF structures, including single, double, or other RESURF structural arrangements, each of which may be referred to herein as a "RESURF transistor."

For convenience of description and without any intended limitation, n-channel LDMOS devices are described and illustrated herein. Thus, p-type islands or other regions are described for an n-type drift region. However, the disclosed devices are not limited to n-channel devices, as p-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

FIG. 1 is a schematic cross-sectional view of an example of an n-channel field LDMOS device 20 constructed in accordance with one embodiment. The device 20 includes a semiconductor substrate 22, which may, in turn, include a number of epitaxial layers 24. In this example, the semiconductor substrate 22 includes a single p-type epitaxial layer P-EPI grown on an original substrate 26. The original substrate 26 may be a heavily, moderately, or lightly doped p-type substrate in some cases, such as those having multiple epitaxial layers. The device 20 may alternatively or additionally include non-epitaxial layers in which one or more device regions are formed. Any one or more of the layers of the semiconductor substrate 22 may include silicon. The structural, material, and other characteristics of the semiconductor substrate 22 may vary from the example shown. For example, the semiconductor substrate 22 may include a silicon-on-insulator (SOI) construction. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

A device area 28 is depicted in FIG. 1. The device area 28 may include or correspond with the active area(s) of the device 20. In some embodiments, the device area 28 is defined by one or more doped isolating layers or regions in the semiconductor substrate 22 (e.g., the epitaxial layer 24). The doped isolating layer(s) or region(s) may laterally and/or otherwise surround the device area 28. These layers or regions act as a barrier or isolation layer separating the device area 28 from the rest of the substrate 22 (or the original substrate 26). In this example, an N-type buried layer (NBL) 30 is formed or disposed in the semiconductor substrate 22, which may be formed in the epitaxial layer 24 thereof. The NBL 30 extends across (e.g., under) the device area 28 to act as a barrier or isolation layer separating the device area of the device 20 from the original substrate 26. The NBL 30 may constitute one of several doped isolating regions surrounding the device area 28 of the device 20. The device area 28 may alternatively or additionally be defined by one or more isolation regions, such as a shallow trench isolation (STI) region.

The example depicted in FIG. 1 may also include a moderately or heavily doped n-type isolating well laterally surrounding the device area 28. The isolating well may be ring-shaped. The isolating well may be disposed on or otherwise above the NBL 30 and outside of, or along, the lateral periphery of the device area 28 as shown. The isolating well (or a part thereof) may be formed in conjunction with one or more n-type wells, such as an n-type drift region described below. The isolating well may be connected to the NBL 30 via one or more link regions. The link regions may be formed via an implantation procedure apart from those used to form the isolating well and the NBL 30. The implantation procedure may be an existing (i.e., available) implantation procedure configured to form a component of another device. The existing implantation procedure may thus provide a convenient technique for linking the isolating well and the NBL 30. With such linking, the NBL 30, the isolating well, and the link region may thus be biased at the same voltage.

One or more of the above-described isolating regions may have a dopant concentration level and/or be otherwise configured for high voltage (HV) operation (e.g., high side operation in which the terminals of the device 20 are level shifted relative to the semiconductor substrate 22, which is typically grounded), including punch-through prevention. Any number of the isolating wells, sinks, or buried layers may be connected to one another. Additional, fewer, or alternative isolation layers or regions may be provided in the semiconductor substrate 22.

The device 20 includes a device body or body region 36 in the semiconductor substrate 22. In this example, the body region 36 is a p-type well formed in the epitaxial layer 24 of the substrate 22. The p-type well may be configured for high voltage operation and/or high side operation. The body region 36 may be biased via one or more heavily doped p-type body contact regions or electrodes 38 formed in or otherwise above the p-type well of the body region 36 in the semiconductor substrate 22. The dopant concentration of each contact region 38 may be at a level sufficient to establish an ohmic contact to the body region 36.

The device 20 includes heavily doped source and drain regions 40 and 42 in the semiconductor substrate 22. The source and drain regions 40 and 42 are laterally spaced from one another. In some embodiments, the source and drain regions 40 and 42 may have additional or alternative lateral spacing. Any number of source or drain regions 40, 42 may be provided. For example, the drain region 42 may be centered or otherwise disposed between, or laterally surrounded by, two portions of the source region 40 or two separate source regions. In this example, the source and drain regions 40 and 42 are n-type doped portions of the epitaxial layer 24. The heavily doped n-type source region 40 is disposed within, on, and/or otherwise above the body region 36. The heavily n-type doped drain region 42 is spaced from the body region 36. Such spacing defines a conduction path of the device between the source and drain regions 40, 42. The regions 40, 42, or a portion thereof, may have a dopant concentration at a level sufficient to establish ohmic contacts for biasing the source region 40 and the drain region 42. In a typical LDMOS configuration, the drain region 42 is biased at a high voltage, Vds, relative to the source region 40.

The device 20 includes channel and field gate structures 44, 45 supported by the semiconductor substrate 22. The gate structures 44, 45 are formed on or above a surface 46 of the semiconductor substrate 22. In this example, the gate structures 44, 45 are disposed between the source regions 40 and the drain region 42 and arranged in a split-gate configuration. The split-gate configuration may be mirrored on the other side of the drain region 42, in which case two transistors may be symmetrically arranged to share the same drain region 42. Alternatively, the device 20 may be configured as a single transistor with a dual gate finger configuration. Each gate structure 44, 45 is located on or above a respective gate dielectric (not shown). For example, the gate dielectric may include silicon dioxide (or oxide) deposited or otherwise formed on the surface 46. Each gate structure 44, 45 includes a conductive gate layer (e.g., a polysilicon plate) on or above the gate dielectric, which insulates the conductive gate layer from the substrate 22. Each gate structure 44, 45 may include one or more dielectric sidewall spacers 48 disposed along lateral edges of the gate structure 44, 45. The sidewall spacers 48 may cover the lateral edges to act as a silicide block to prevent a silicide short along the surface 46. The sidewall spacers 48 may provide spacing to separate the conductive components of the gate structure 44 from the source region 40 and other regions or active areas in the device area 28. In this example, one of the sidewall spacers 48 is used for alignment purposes in defining an edge of the source region 40. The edges of other regions may be aligned with the gate structure 44 as described below.

The configuration of each gate structure 44, 45 may vary. The configuration of each gate structure 44, 45 may include multiple conductive layers (e.g., polysilicon plates). The components, materials, and other characteristics of the gate structures 44, 45 may vary from the example shown.

A number of shallow trench isolation (STI) regions 50 may be formed at the surface 46 in the semiconductor substrate 22. In this embodiment, one STI region 50 is disposed between the drain region 42 and several of the above-referenced structures of the device 20, including, for instance, the body region 36, the source region 40, and the gate structure 44. The STI region 50 may thus provide some shielding of the gate structure 44 from the high voltage applied to the drain region 42. These and other ones of the STI regions 50 may be configured to minimize hot carrier injection (HCI) into the oxide layer of the channel gate structure 44.

Other STI regions 50 may be disposed in the semiconductor substrate 22 to isolate or separate various contact regions, such as the body contact region 38 and the source region 40, as well as other regions for biasing components of the device 20. For example, another STI region may be used to separate an isolation contact region and a substrate contact region.

The device 20 may be configured with one or more lightly or intermediately doped transition regions 52 (e.g., n-type lightly doped drain, or NLDD, regions) at or near the source and drain regions 40 and 42. Each transition region may be or include a diffused region formed in connection with the source region 40 and/or the drain region 42 and may be, thus, referred to herein as a source/drain extension region. Such transition regions may assist in controlling the electric field at or near the surface 46, including in areas other than those areas near the source region 40 or the drain region 42.

When the channel gate structure 44 is biased, charge carriers (in this case, electrons; alternatively, holes) accumulate in a channel area or region 54. The channel region 54 is located in the body region 36 under the channel gate structure 44. The accumulation of electrons results in a charge inversion in the channel region 54 from the p-type body region 36 to an n-type conduction layer or area near the surface 46 of the semiconductor substrate 22. Once a sufficient amount of the charge carriers accumulate in the channel region 54, charge carriers are capable of flowing along a conduction path from the source region 40 to the drain region 42.

The channel region 54 is not limited to areas within the body region 36. For instance, charge carriers may accumulate in an area near the surface 46 in a region of the epitaxial layer 24 adjacent the body region 36. A portion of the epitaxial layer 24 may be disposed between the body region 36 and an n-type well or drift region described below (e.g., when the body region 36 does not touch or abut the n-type well or drift region as shown).

The conduction path or regions of the device 20 may include still other regions, whether n-type or p-type, at or near the surface 46. For example, the channel region 56 and/or other conduction region of the device 20 may include one or more intermediately doped n-type transition regions (e.g., one of the NLDD regions described above) in the semiconductor substrate 22.

The conduction path may include other regions or areas in the semiconductor substrate 22 in which charge accumulation occurs as a result of the bias applied to the channel gate structure 44. The conduction path of the device 20 is not limited to regions in which charge inversion occurs or to regions in which conduction is enabled or enhanced via the bias voltage applied to the gate structure 44. In this example, charge carriers also gather along the surface 46 in an accumulation region 56 outside of or beyond the body region 36. The channel gate structure 44 may extend over the accumulation region 56. In the embodiment of FIG. 1, the channel gate structure 44 extends over a portion of the accumulation region 56. Creation of the accumulation region 56 may thus be controlled during operation by the channel gate structure 44. The accumulation region 56 is not limited to areas under the channel gate structure 44. For example, the accumulation region 56 may extend beyond the channel gate structure 44 and the spacer 48 toward the STI region 50.

The conduction path of the device 20 is not limited to regions at or near the surface 46. In this example, the conduction path includes a portion of a drift region 58 through which charge carriers drift under the electric field arising from the bias voltage applied between the source and drain regions 40, 42. In this segment of the conduction path, the charge carriers drift from the accumulation region 56 and around (e.g., under) the STI region 50 in the drift region 58 to reach the drain region 42. The drift region 58 may thus electrically couple the drain region 42 to the accumulation region 56 and, in turn, the channel region 54.

The drift region 58 is provided via an n-type well that surrounds the STI region 50. A portion of the accumulation region 56 may be created in the n-type well. The accumulation region 56 may be adjacent the drift region 58. The drain region 42 is formed within or above the n-type well. The n-type well need not abut the body region 36 as shown. The lateral extent of the n-type well may vary. In one example, a portion of the epitaxial layer 24 is disposed between the body region 36 and the n-type well.

In this example, the n-type well of the drift region 58 is disposed adjacent and above a RESURF region 60. The RESURF region 60 includes a buried p-type well configured to deplete the n-type well along the junction between the n-type and p-type wells to establish a RESURF effect. The n-type well may thus be depleted in multiple dimensions, both laterally and vertically. The RESURF region 60 is disposed between the drift region 58 and the NBL 30. The RESURF region 60 may thus also be depleted along the junction with the NBL 30. In some cases, the RESURF region 60 is completely depleted to maximize the RESURF effect. The RESURF effect is directed to decreasing the electric field in areas in and/or around the drift region 58 to increase the intrinsic breakdown voltage (BVdss) level of the device 20. The presence of the RESURF region 60 between the drift region 58 and the NBL 30 may protect against a breakdown path through the original substrate 26.

The electric field in the active area of the device 20 may be further managed via the application of the gate voltage to the field gate structure 45. The gate structures 44, 45 may be electrically tied to one another as shown via, for instance, an interconnect 61 in a metal layer of the device 20. The voltage applied to the field gate structure 45 may further deplete the drift region 58 under and around the STI region 50, thereby improving the BVdss level of the device 20.

The components and other characteristics of the drift region(s) of the device 20 may vary from the example shown. For example, the device 20 need not include the RESURF region 60. In some cases, the RESURF region 60 is spaced from the drift region 58 and/or the NBL 30. The p-type epitaxial layer 24 may be disposed between the RESURF region 60 and other device regions in such cases.

A protection region 62 is disposed adjacent the STI region 50. In this example, the protection region 62 is disposed along a sidewall of the STI region 50 facing the channel region 54 (i.e., the channel side of the STI region 50). The protection region 62 may be configured to protect the STI region 50 from degradation and other effects of hot carrier injection (HCI) through the sidewall of the STI region 50. The protection region 62 may thus be referred to as an HCI protection region. The protection region 62 may be disposed adjacent or along the surface 46 of the semiconductor substrate 22, such as along an interface between the STI region 50 and the surface 46. The protection region 62 may alternatively or additionally be disposed at or along a transition or interface between the accumulation region 56 and the drift region 58. In this example, the protection region 62 is disposed at the surface 46 of the semiconductor substrate 22. The protection region 62 may be located along a corner that would otherwise be formed at the intersection of the surface 46, the STI region 50, and the n-type well of the drift region 58.

The protection region 62 may be disposed adjacent the accumulation region 56. In some cases, the protection region 62 is disposed between the accumulation region 56 and the STI region 50. Alternatively or additionally, the protection region 62 may be disposed within the accumulation region 56.

The protection region 62 may be adjacent to or disposed within the accumulation region 56 to provide a buffer between the charge carriers and the STI region 50. In some cases, a portion of the protection region 62 may be disposed within or along the accumulation region 56.

In other cases, the protection region 62 may be spaced from the accumulation region 56. The location relative to the accumulation region 56 may vary depending upon the lateral extent of the channel gate structure 44, the bias voltage applied to the channel gate structure 44, and/or other factors. In this example, the protection region 62 is disposed in a gap between the channel gate structure 44 and the field gate structure 45.

The protection region 62 may be configured as a p-type floating region. The dopant level concentration, depth, and/or other characteristics of the profile of the protection region 62 may correspond with, or match, those profile characteristics obtained via an implant procedure for a lightly or moderately doped transition or source/drain extension region (e.g., an LDD region). For example, the dopant concentration level of the protection region 62 may match or otherwise correspond with the dopant concentration level of the extension region 52. However, the dopant concentration levels of the extension region 52 and the protection region 62 need not match, insofar as the two regions have different conductivity types. The protection region 62 may be formed via the same implant procedure used to form such transition or source/drain extension regions for other devices. The protection region 62 may thus be referred to as a p-type LDD region, or PLDD region, disposed within or adjacent the accumulation region 56 or the drift region 58 (rather than at one of the source or drain regions 40, 42). The dopant concentration level of the protection region 62 may be lower than the n+ or p+ levels used in the Ohmic contact regions of the device 20.

The device 20 is shown in simplified form and, thus, FIG. 1 does not show the conductive (e.g., ohmic) contacts and other metal layers configured for electric coupling with the source regions 40, the drain region 42, and the gate structures 44. The device 20 may have a number of other structures or components for connectivity, isolation, passivation, and other purposes not shown in FIG. 1 for ease in illustration. For instance, the device 20 may include any number of additional isolating regions or layers. In some examples, another p-type epitaxial layer (not shown) may be disposed between the original substrate 26 and the surface of the substrate in the device area 28. One or more further STI regions, other isolation trenches, and/or isolation wells (not shown) may be provided to isolate the device area 28 and/or active area of the device 20.

The dopant concentrations, thicknesses, and other characteristics of the above-described semiconductor regions in the semiconductor substrate 22 may vary. In one example of the embodiment shown in FIG. 1, the above-referenced semiconductor regions may have the following approximate concentrations and thicknesses:

|  | Concentration | Thickness |
|---|---|---|
| p-epi 24: | $1 \times 10^{15}/cm^3$ | 1.1 μm |
| substrate 26: | $1 \times 10^{15}/cm^3$ | not applicable |
| NBL 30 | $5 \times 10^{18}/cm^3$ | 1 μm |
| body 36: | $1 \times 10^{17}/cm^3$ | 0.9 μm |
| source 40: | $1 \times 10^{21}/cm^3$ | 0.25 μm |
| drain 42: | $1 \times 10^{21}/cm^3$ | 0.25 μm |
| NLDD 52: | $1 \times 10^{19}/cm^3$ | 0.1 μm |
| drift 58 | $1 \times 10^{17}/cm^3$ | 1.5 μm |
| RESURF 60 | $2 \times 10^{17}/cm^3$ | 0.5 μm |
| PLDD 62 | $1 \times 10^{19}/cm^3$ | 0.1 μm |

The concentrations and thicknesses may be different in other embodiments. For example, the dopant concentration of the original substrate 26 may vary considerably.

Figure 2:
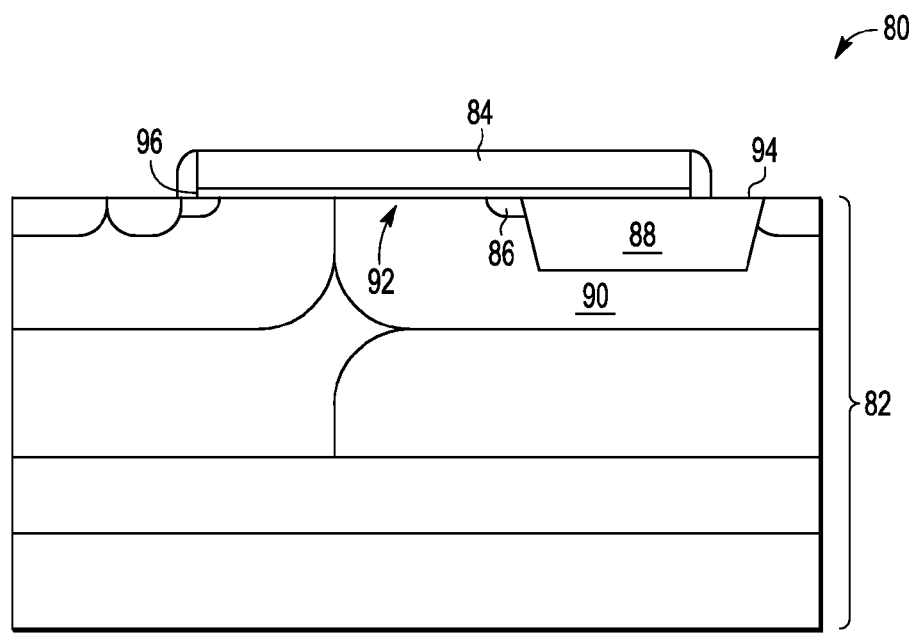
FIG. 2 is a is a cross-sectional, schematic view of an exemplary field drift LDMOS transistor with an accumulation region having an HCI protection region under a gate structure in accordance with one embodiment.

FIG. 2 depicts another exemplary LDMOS transistor device 80 configured in accordance with one or more aspects of the disclosure. The device 80 has an arrangement of semiconductor regions in a semiconductor substrate 82 similar to the example shown in FIG. 1. The embodiment of FIG. 2 differs from the above-described example in that a gate structure 84 supported by the semiconductor substrate 82 laterally extends over an HCI protection region 86. The gate structure 84 also extends laterally over portions of an STI region 88 and a drift region 90 within which the STI region 88 and the HCI protection region 86 are disposed. A separate field gate structure is not used in this example. The extent to which the gate structure 84 extends over the STI region 88 and the drift region 90 may vary from the example shown in FIG. 2.

The HCI protection region 86 is adjacent to an accumulation region 92 created during operation upon application of a bias voltage to the gate structure 84. The accumulation region 92 is disposed within the drift region 90 at or near a surface 94 of the semiconductor substrate 82. The HCI protection region 86 is disposed between the accumulation region 92 and the STI region 88. In this example, the accumulation region 92 and the STI region 88 may be spaced apart by the HCI protection region 86.

The HCI protection region 86, the STI region 88, and the drift region 90 may be otherwise configured as described above. For example, the HCI protection region 86 is disposed along or at the surface 94 along an interface of the STI region 88 and the drift region 90.

The HCI protection region 86 may protect the STI region 88 from HCI effects as described herein. In this embodiment, the HCI protection region 86 may also protect a gate oxide 96 of the gate structure 84 from HCI effects. The HCI protection region 86 may shield those portions of the gate oxide 96 disposed over the HCI protection region 86 and the STI region 88. The drain-side portion of the gate oxide 96 may thus be shielded from charge carriers.

Figure 3:
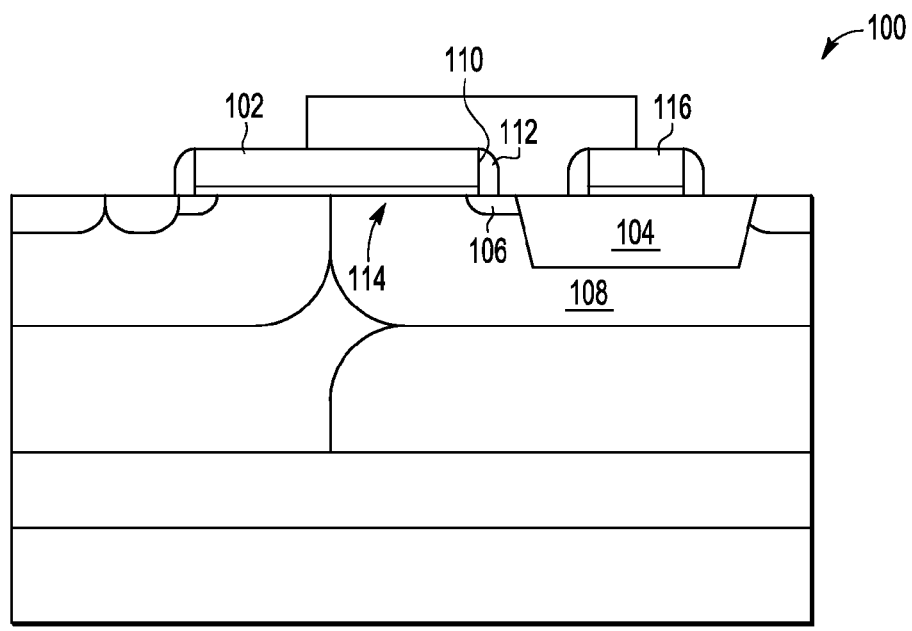
FIG. 3 is a cross-sectional, schematic view of an exemplary field drift LDMOS transistor with an accumulation region having an HCI protection region self-aligned with a gate structure in accordance with one embodiment.

FIG. 3 depicts another exemplary LDMOS transistor device 100 having a modified gate arrangement. The LDMOS device 100 may have a number of other semiconductor regions and other features in common with the examples described above. In this example, the device 100 has a split-gate arrangement similar to the example of FIG. 1, but with a channel gate structure 102 and an STI region 104 configured to self-align an HCI protection region 106. The channel gate structure 102 laterally extends over a drift region 108 within which the HCI protection region 106 and the STI region 104 are disposed. The lateral extent of the channel gate structure 102 and/or the STI region 104 allow the HCI protection region 106 to be disposed along or below a drain-side edge 110 of the channel gate structure 102. The edge 110 may be covered by a spacer 112 after an implantation procedure is implemented to form the HCI protection region 106. Diffusion of the p-type dopant may result in a lateral profile for the HCI protection region 106 in which the channel gate structure 102 is disposed over a portion of the HCI protection region 106. Alternatively or additionally, the implantation procedure may be implemented at an angle to achieve the desired lateral profile.

The self-alignment of the HCI protection region 106 may also position the HCI protection region 106 along an accumulation region 114 created in the drift region 108 during operation. The lateral diffusion and/or implantation procedure of the HCI protection region 106 may be configured to determine the extent to which the HCI protection region 106 extends into the area that would otherwise form part of the accumulation region 114. The lateral diffusion of the HCI protection region 106 may also protect a portion of the gate oxide of the channel gate structure 102.

The embodiment of FIG. 3 also includes a field gate structure 116 over the STI region 104. The drain-side edge 110 is on a side of the channel gate structure 102 that faces the field gate structure 116. The field gate structure 116 may be electrically tied to the channel gate structure 102 as described above. The self-aligned HCI protection region 106 may be incorporated into transistor devices not having a field gate structure.

Figure 4:
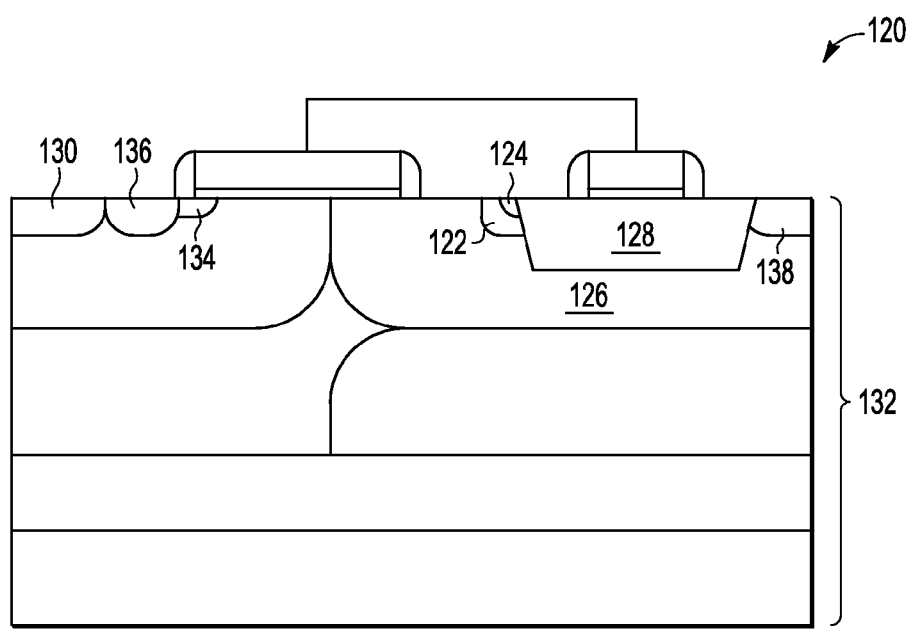
FIG. 4 is a cross-sectional, schematic view of an exemplary field drift LDMOS transistor with an accumulation region having an HCI protection region configured in accordance with another embodiment.

FIG. 4 depicts another exemplary LDMOS transistor device 120 having a modified HCI protection arrangement in which a protection region 122 is disposed around a periphery of a transition or source/drain extension region 124. The protection region 122 may be configured as a p-type halo region around the n-type dopant of the transition region 124. The protection region 122 and the transition region 124 are disposed within a drift region 126. In this embodiment, however, the transition region 124 is disposed in the corner of the intersection of the drift region 126, an STI region 128, and a surface 130 of a semiconductor substrate 132. The protection region 122 wraps around the transition region 124 along the corner and, more generally, the interface between the drift region 126 and the STI region 128. The protection region 122 may thus reach the surface 130 but at a position spaced from the intersection or corner.

The transition region 124 may be formed as one of multiple source/drain extension regions. For example, the device 120 may include a transition or source/drain extension region 134 that extends laterally from a source region 136, which, in turn, is spaced from a drain region 138. The transition regions 124 and 134 may be formed via a common implantation procedure and may thus be doped at a matching or corresponding concentration levels. The dopant concentration level of the transition regions 124 and 134 may be lower than the dopant concentration level of the source and drain regions 136 and 138. The dopant concentration level of the source and drain regions 136 and 138 may be sufficient to establish respective Ohmic contacts.

The protection region 122 may have a dopant concentration profile that matches or corresponds with the profile of a source/drain peripheral or halo region formed in other transistor devices in the circuit or electronic apparatus in which the LDMOS transistor device 120 is disposed. For example, the electronic apparatus may include a number of logic devices (e.g., n-channel MOS transistor devices) having spaced apart source and drain regions with extensions configured with regions that correspond with the protection region 122 and the transition region 124. The p-type region corresponding with the protection region may be configured as a halo around an LDD region. Such p-type regions may be used to define the lateral range of the n-type dopant of the LDD region in the channel region of the logic device (rather than rely solely on the diffusion of the dopant to determine the lateral range). The dopant concentration level of the protection region 122 may thus fall in a range of concentration levels appropriate for a channel region of a logic device. For example, the dopant concentration level of the protection region 122 may fall in a range from about $5 \times 10^{17}/cm^3$ to about $5 \times 10^{18}/cm^3$. In some cases, the protection region 122 and the transition region 124 are formed via implantation procedures that share a common mask. For example, the transition region 124 may be formed via an implant oriented at 0 degrees, while the protection region 122 may be formed via a high energy implant (e.g., higher than the implant for the transition region) oriented at, e.g., 35 degrees. The higher energy and angled orientation may configure the protection region 122 to enclose or wrap around the transition region 122 vertically and laterally.

Both the protection region 122 and the transition region 124 may thus be formed using implantation procedures pre-existing or already available in the fabrication process flow. Dedicated masks and implantation procedures are not added to the process flow to form the protection region 122, as in the examples described above. The embodiment of FIG. 4 may be achieved in process flows not having a separate implantation procedure for a p-type source/drain extension (but rather only one for an n-type source/drain extension).

The modified HCI protection arrangement described above in connection with FIG. 4 may be applied in other device configurations. For example, the modified HCI protection arrangement is not limited to devices having a split-gate arrangement. The modified HCI protection arrangement may be used in a self-aligned configuration.

Figure 5:
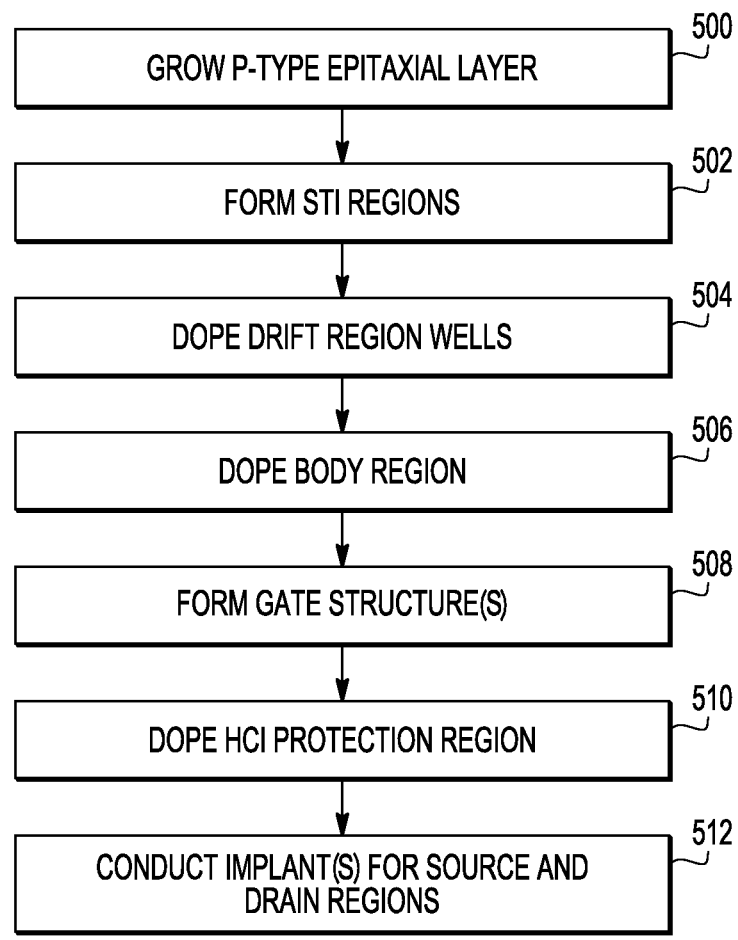
FIG. 5 is a flow diagram of an exemplary fabrication sequence to construct a field drift LDMOS transistor having an HCI protection region in accordance with one embodiment.

FIG. 5 shows an exemplary fabrication method for fabricating a device with an HCI protection region configured as described above. The method may be directed to fabricating an LDMOS transistor device having either a simple (e.g., homogenous) or composite protection region arrangement as described above. The transistor device is fabricated with a semiconductor substrate, the regions or layers of which may have the conductivity types of the n-channel examples described above, or be alternatively configured to support a p-channel device. The method includes a sequence of acts or steps, only the salient of which are depicted for convenience in illustration. The ordering of the acts may vary in other embodiments. For example, a body region doping step 506 may be implemented before a drift well region doping step 504. The fabrication method is not limited to any particular doping mechanism, and may include future developed doping techniques.

The method may begin with, or include, a step 500 in which a p-type epitaxial layer (p-epi) is grown on a p-type semiconductor substrate. In some cases, the step 500 includes the formation via, e.g., ion implantation, of one or more buried isolating layers (e.g., an NBL layer) in the epitaxial layer. The buried layer may be configured via a mask to extend across an active area of the transistor device. One or more other doped isolating regions may be formed at this time to define the lateral boundaries of the active area. In some cases, the step 500 includes the growth of another p-type epitaxial layer. Any number of epitaxial layers may be grown.

In this embodiment, STI regions are formed in a step 502 in the substrate. Some of the STI regions are located in an area in which a drift region is formed. The STI regions may be formed via any now known or hereafter developed procedure. For example, the step 502 may include the formation of a trench and the deposition (e.g., chemical vapor deposition, or CVD) of one or more materials in the trench. In some embodiments, the trench is filled with silicon oxide. Additional or alternative materials may be deposited. In an alternative embodiment, the STI region is formed after the drift region is formed.

In a step 504, the substrate is doped to form the drift region of the device. The doping procedure may include an n-type dopant implantation configured to define an n-type well. In a step 506, a p-type well is formed to dope a body region of the substrate. The body region may be spaced from or adjacent to the drift region as described above. A heavily doped p-type contact region for the body region may be formed in the p-type well via a separate ion implantation procedure. One or more gate structures may then be formed in a step 508, which may include the deposition or growth of a gate oxide layer and a conductive gate layer (e.g., a polysilicon layer), as well as patterning (e.g., etching) of such layers. The gate structure(s) may be patterned into a split-gate arrangement having a channel gate structure and a field gate structure as described above.

In a step 510, a p-type protection region is formed within the drift region alongside or adjacent the STI region. In some cases, the protection region is aligned with a drain-side edge of the channel gate structure. For example, the protection region may be formed by an implantation procedure implemented after the gate structure(s) are formed such that the protection region is disposed in alignment with an edge of the gate structure over the channel. In other cases, the protection region is formed before the channel gate structure is formed, such as in the embodiment of FIG. 2.

The protection region may be formed before, concurrently, or after the implementation of the implantation procedure(s) shown in a step 512. Source and drain regions may be formed, using the gate structure for self-alignment of the source region. One or more n-type ion implantation procedures may be performed. For example, formation of one or both of the source region and the drain region may include a moderate implant before formation of sidewall spacers of the gate structure to create one or more transition regions (see, e.g., FIG. 1). A heavy implant after formation of the sidewall spacers may then be implemented to form the source and/or drain regions adjacent to such transition regions.

Additional acts may be implemented at various points during the fabrication procedure. For example, one or more acts may be directed to defining an active area of the device. In some cases, such acts may include the formation of one or more device isolating wells, layers, or other regions. One or more metal layers may be deposited. Any number of additional STI regions may be formed. The procedures may be implemented in various orders. Additional or alternative procedures may be implemented.

The disclosed devices include a protection region within an accumulation region of a drift region. The protection region is of a different conductivity type than the drift region, and is disposed next to a field STI region to block charge carriers from reaching the STI region. The protection region may facilitate the depletion of the accumulation region and, more generally, the drift region around (e.g., under) the protection region. Such depletion may reduce the effects of the drain potential in the accumulation region, as well as reduce the strength of the electric field in and around the junction between the body and drift regions. Impact ionization may thus be reduced, and the BVdss breakdown level of the device may be improved. In operating conditions involving high bias voltages on the both the drain and the gate, the protection region may relax the electric field at the substrate surface (e.g., between the gate structures), thereby reducing the generation of hot carriers in those areas. In the event that hot carriers are generated in such areas, the protection region blocks such hot carriers from reaching and damaging the STI sidewall. HCI reliability may thus be improved.

The protection region may be formed to provide the above-described advantages without involving an additional mask or other process steps. The protection region may instead be formed via a modification of the mask layout for one or more pre-existing implantation steps for other transistor devices. In some cases, the pre-existing mask layout is a p-type LDD mask. In other cases, an n-type LDD mask and p-type peripheral or halo mask are modified.

In a first aspect, a device includes a semiconductor substrate, a drift region in the semiconductor substrate and having a first conductivity type, an isolation region within the drift region, and around which charge carriers drift on a path through the drift region during operation, and a protection region adjacent the isolation region in the semiconductor substrate, having a second conductivity type, and disposed along a surface of the semiconductor substrate.

In a second aspect, an electronic apparatus includes a substrate and a transistor disposed in the substrate. The transistor includes first and second semiconductor regions having a first conductivity type and between which a voltage is applied during operation, a third semiconductor region having a second conductivity type and within which the first semiconductor region is disposed, a fourth semiconductor region having the first conductivity type and within which the second semiconductor region is disposed, an isolation region within the fourth semiconductor region, and around which charge carriers drift on a path through the fourth semiconductor region under the applied voltage, and a fifth semiconductor region adjacent the isolation region, having the second conductivity type, and disposed along a surface of the substrate.

In a third aspect, a method of fabricating a transistor includes forming a drift region of the transistor in a semiconductor substrate, the drift region having a first conductivity type, creating an isolation region within the drift region such that charge carriers drift around the isolation region on a path through the drift region during operation, and doping the semiconductor substrate with dopant of a second conductivity type to form a protection region adjacent the isolation region and disposed along a surface of the semiconductor substrate.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
a semiconductor substrate;
a drift region in the semiconductor substrate and having a first conductivity type;
a gate structure supported by the semiconductor substrate and comprising sidewall spacers;
an isolation region within the drift region, laterally spaced from the gate structure, and around which charge carriers drift on a path through the drift region during operation; and
a protection region having a second conductivity type, and disposed along a surface of the semiconductor substrate at a position adjacent the isolation region and in which at least a part of the protection region is both disposed along a channel-side sidewall of the isolation region and not disposed under the gate structure.

2. The device of claim 1, wherein the protection region is disposed along a transition between the drift region and an accumulation region in which the charge carriers accumulate during operation before drifting on the path through the drift region.

3. The device of claim 1, wherein the gate structure is configured to control creation of an accumulation region along the surface of the semiconductor substrate during operation, wherein the protection region is adjacent the accumulation region.

4. The device of claim 1, wherein the gate structure is configured to control creation of a channel region along the surface of the semiconductor substrate during operation, wherein the protection region is entirely disposed along a side of the isolation region facing the channel region.

5. The device of claim 1, further comprising a further gate structure supported by the semiconductor substrate wherein:
the first-named gate structure is configured to control creation of a channel region along the surface of the semiconductor substrate;
the further gate structure is disposed over the isolation region; and
the protection region is disposed between the first-named and further gate structures.

6. The device of claim 1, further comprising a further gate structure supported by the semiconductor substrate wherein:
the first-named gate structure is configured to control creation of a channel region along a surface of the semiconductor substrate;
the further gate structure is disposed over the isolation region; and
the protection region is disposed below an edge of the first-named gate structure that faces the further gate structure.

7. The device of claim 1, further comprising source and drain regions spaced from one another in the semiconductor substrate and having the first conductivity type, wherein:
the source region comprises a contact region having a first dopant concentration level configured to support an Ohmic contact and a source/drain extension region extending laterally from the contact region toward the drain region and having a second dopant concentration level lower than the first dopant concentration level; and
the protection region is doped at a level corresponding with the second dopant concentration level.

8. The device of claim 1, further comprising
an internal region disposed adjacent the isolation region along the surface of the semiconductor substrate and having the first conductivity type;
wherein the protection region is configured as a halo region around the internal region.

9. A device comprising:
a semiconductor substrate;
a drift region in the semiconductor substrate and having a first conductivity type;
an isolation region within the drift region and around which charge carriers drift on a path through the drift region during operation; and
a protection region adjacent the isolation region in the semiconductor substrate, having a second conductivity type, and disposed along a surface of the semiconductor substrate;
source and drain regions spaced from one another in the semiconductor substrate and having the first conductivity type, wherein the source region comprises a contact region having a first dopant concentration level configured to support an Ohmic contact and a first source/drain extension region extending laterally from the contact region toward the drain region and having a second dopant concentration level lower than the first dopant concentration level; and
a second source/drain extension region within the drift region, having the first conductivity type, and disposed along a corner of the interface between the drift region and the isolation region, wherein:

the protection region is disposed around a periphery of the second source/drain extension region; and the second source/drain extension region is doped at a level corresponding with the second dopant concentration level.

10. An electronic apparatus comprising:

a substrate; and a transistor disposed in the substrate, the transistor comprising:

first and second semiconductor regions having a first conductivity type and between which a voltage is applied during operation;

a third semiconductor region having a second conductivity type and within which the first semiconductor region is disposed;

a fourth semiconductor region having the first conductivity type and within which the second semiconductor region is disposed;

a gate structure supported by the substrate and comprising sidewall spacers;

an isolation region within the fourth semiconductor region, laterally spaced from the gate structure, and around which charge carriers drift on a path through the fourth semiconductor region under the applied voltage; and a fifth semiconductor region having the second conductivity type, and disposed along a surface of the substrate at a position adjacent the isolation region and in which at least a part of the fifth semiconductor region is both disposed along a channel-side sidewall of the isolation region and not disposed under the gate structure.

11. The electronic apparatus of claim 10, wherein the fifth semiconductor region is floating.

12. The electronic apparatus of claim 10, further comprising a further gate structure supported by the substrate wherein:

the first-named gate structure is configured to control creation of a channel region along the surface of the substrate;

the further gate structure is disposed over the isolation region; and the fifth semiconductor region is disposed between the first-named and further gate structures.

13. The electronic apparatus of claim 10, further comprising a further gate structure supported by the substrate wherein:

the first-named gate structure is configured to control creation of a channel region along the surface of the substrate;

the further gate structure is disposed over the isolation region; and the fifth semiconductor region is disposed below an edge of the first-named gate structure that faces the further gate structure.

14. An electronic apparatus comprising:

a substrate; and a transistor disposed in the substrate, the transistor comprising:

first and second semiconductor regions having a first conductivity type and between which a voltage is applied during operation, wherein the first semiconductor region comprises a contact region having a first dopant concentration level configured to support an Ohmic contact and a first source/drain extension region extending laterally from the contact region toward the second semiconductor region and having a second dopant concentration level lower than the first dopant concentration level;

a third semiconductor region having a second conductivity type and within which the first semiconductor region is disposed;

a fourth semiconductor region having the first conductivity type and within which the second semiconductor region is disposed;

an isolation region within the fourth semiconductor region, and around which charge carriers drift on a path through the fourth semiconductor region under the applied voltage;

a fifth semiconductor region adjacent the isolation region, having the second conductivity type, and disposed along a surface of the substrate;

a second source/drain extension region within the fourth semiconductor region, having the first conductivity type, disposed along a corner of the interface between the fourth semiconductor region and the isolation region, wherein:

the fifth semiconductor region is disposed around a periphery of the second source/drain extension region; and the second source/drain extension region is doped at a level corresponding with the second dopant concentration level.

15. A method of fabricating a transistor, the method comprising:

forming a drift region of the transistor in a semiconductor substrate, the drift region having a first conductivity type;

creating an isolation region within the drift region such that charge carriers drift around the isolation region on a path through the drift region during operation;

forming a gate structure on the semiconductor substrate; and after forming the gate structure, doping the semiconductor substrate with dopant of a second conductivity type to form a protection region disposed along a surface of the semiconductor substrate at a position adjacent the isolation region and in which at least part of the protection region is not disposed under the gate structure.

16. The method of claim 15, further comprising forming a further gate structure on the semiconductor substrate wherein:

the first-named gate structure is configured to control creation of a channel region along the surface of the semiconductor substrate;

the further gate structure is disposed over the isolation region; and the protection region is disposed between the first-named and further gate structures.

17. The method of claim 15, further comprising a further gate structure on the semiconductor substrate wherein:

the first-named gate structure is configured to control creation of a channel region along the surface of the semiconductor substrate;

the further gate structure is disposed over the isolation region; and doping the semiconductor substrate to form the protection region is implemented after the first-named and further gate structures are formed such that the protection region is disposed in alignment with an edge of the first-named gate structure that faces the further gate structure.

18. The method of claim 15, further comprising forming source and drain regions spaced from one another in the semiconductor substrate and having the first conductivity type with a first implant configured to define a contact region having a first dopant concentration level configured to support an Ohmic contact and with a second implant configured to define a first source/drain extension region extending laterally from the contact region toward the drain region and having a second dopant concentration level lower than the first dopant concentration level, wherein:

the second implant forms a second source/drain extension region within the drift region, having the first conductivity type, and disposed along a corner of the interface between the drift region and the isolation region, with the second implant wherein:

the protection region is disposed around a periphery of the second source/drain extension region.

19. The method of claim 15, further comprising forming source and drain regions spaced from one another in the semiconductor substrate and having the first conductivity type with a first implant configured to define a contact region having a first dopant concentration level configured to support an Ohmic contact and with a second implant configured to define a first source/drain extension region extending laterally from the contact region toward the drain region and having a second dopant concentration level lower than the first dopant concentration level, wherein the protection region is doped at a level corresponding with the second dopant concentration level.

20. A device comprising:
a semiconductor substrate;
a drift region in the semiconductor substrate and having a first conductivity type;
an isolation region within the drift region, and around which charge carriers drift on a path through the drift region during operation;
a protection region adjacent the isolation region in the semiconductor substrate, having a second conductivity type, and disposed along a surface of the semiconductor substrate on a channel side of the isolation region; and
source and drain regions spaced from one another in the semiconductor substrate and having the first conductivity type, wherein the source region comprises a contact region having a first dopant concentration level configured to support an Ohmic contact and a first source/drain extension region extending laterally from the contact region toward the drain region and having a second dopant concentration level lower than the first dopant concentration level; and
a second source/drain extension region within the drift region, having the first conductivity type, and disposed along a corner of the interface between the drift region and the isolation region, wherein:
the protection region is disposed around a periphery of the second source/drain extension region; and
the second source/drain extension region is doped at a level corresponding with the second dopant concentration level.

* * * * *